(12) United States Patent
Shi

(10) Patent No.: US 7,891,994 B2
(45) Date of Patent: Feb. 22, 2011

(54) HOUSING MECHANISM AND ELECTRONIC DEVICE USING THE SAME

(75) Inventor: Zheng Shi, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 805 days.

(21) Appl. No.: 11/833,947

(22) Filed: Aug. 3, 2007

(65) Prior Publication Data
US 2008/0232041 A1 Sep. 25, 2008

(30) Foreign Application Priority Data
Mar. 23, 2007 (CN) .................. 2007 1 0073645

(51) Int. Cl.
*H01R 13/44* (2006.01)
(52) U.S. Cl. .................................... 439/131
(58) Field of Classification Search ............ 439/131, 439/719; 174/68.1, 68.3, 135; 361/825, 361/826
See application file for complete search history.

(56) References Cited

U.S. PATENT DOCUMENTS

| 3,239,297 | A | * | 3/1966 | Bosko .................... 312/231 |
| 4,159,871 | A | * | 7/1979 | Arnone .................... 396/657 |
| 5,683,156 | A | * | 11/1997 | Chen et al. ................ 312/223.2 |
| 6,186,889 | B1 | * | 2/2001 | Byrne .................... 454/184 |
| 6,362,976 | B1 | * | 3/2002 | Winters et al. .............. 361/814 |
| 6,418,113 | B1 | * | 7/2002 | Ikebe et al. .................. 720/738 |
| 6,884,942 | B2 | * | 4/2005 | McGrath et al. ........... 174/68.1 |
| 7,684,200 | B2 | * | 3/2010 | Watanabe et al. ........... 361/727 |

FOREIGN PATENT DOCUMENTS

CN 1930742 A 3/2007

* cited by examiner

*Primary Examiner*—Jean F Duverne
(74) *Attorney, Agent, or Firm*—Jeffrey T. Knapp

(57) ABSTRACT

A housing mechanism (100) includes a main body (10) and a shield (20). The main body includes a pair of guiding portions (142) and at least one port (146) defined through the sidewall (14) thereof. The shield includes a pair of guiding poles (242) provided on an inner surface (24) thereof. The shield cooperates with the main body. The guiding poles slide in the corresponding guiding portions and are selectively positionable/slidable between one of two ends of the respective guiding portions to allow the shield to cover/uncover the at least one port.

13 Claims, 5 Drawing Sheets

US 7,891,994 B2

HOUSING MECHANISM AND ELECTRONIC DEVICE USING THE SAME

BACKGROUND OF THE INVENTION

1. Field of the Invention

The present invention relates to housing mechanisms and, particularly, to a housing mechanism with a shield (i.e., a defending element) configured (i.e., structured and arranged) for protecting a port defined in the housing mechanism of a portable electronic device.

2. Discussion of the Related Art

With the development of information technology, portable electronic devices, such as digital cameras, mp3 players, video cameras, mobile phones, and personal digital assistants (PDAs), are now in widespread use. Connectors are important elements for transmitting data between portable electronic devices and/or for facilitating charging thereof (e.g., linkage to a wall outlet).

In some electronic devices, the connector is plugged into a housing in the electronic devices. One end of the connector has an outer electronic interface provided therein. The housing of the electronic device has a port defined in one sidewall thereof. An inner electronic interface is provided in the housing near the port. When the connector is used, the end having the outer electronic interface is inserted into the port of the housing of the electronic device, thereby engaging the outer electronic interface with the inner electronic interface. This engagement enables the data or power, as the case may be, to be transmitted between varying electronic devices. However, when no connector is connected to the electronic device, the inner electronic interface of the electronic device is liable to become polluted/contaminated by, e.g., dust entering through the port, and, as a consequence, the performance of the inner electronic interface is liable to be compromised/damaged.

Therefore, a new housing mechanism used for a portable electronic device is desired in order to overcome the above-described shortcoming.

SUMMARY

In one aspect thereof, a housing mechanism includes a main body and a shield. The main body includes a pair of guiding portions/slots and at least one port defined through the sidewall thereof. The shield includes a pair of guiding poles/pins provided on an inner surface thereof. The shield cooperates with the main body. The guiding poles slide in the corresponding guiding portions and are selectably positionable between two ends, inclusively, of the guiding portions to allow the shield to cover/uncover the at least one port.

Other advantages and novel features of the embodiments will become more apparent from the following detailed description thereof when taken in conjunction with the accompanying drawings.

BRIEF DESCRIPTION OF THE DRAWINGS

Many aspects of the housing mechanism and the electronic device using the same can be better understood with reference to the following drawings. The components in the drawings are not necessarily to scale, the emphasis instead being placed upon clearly illustrating the principles of the present housing mechanism. Moreover, in the drawings, like reference numerals designate corresponding parts throughout the several views.

DETAILED DESCRIPTION OF THE PREFERRED EMBODIMENT

Figure 1:
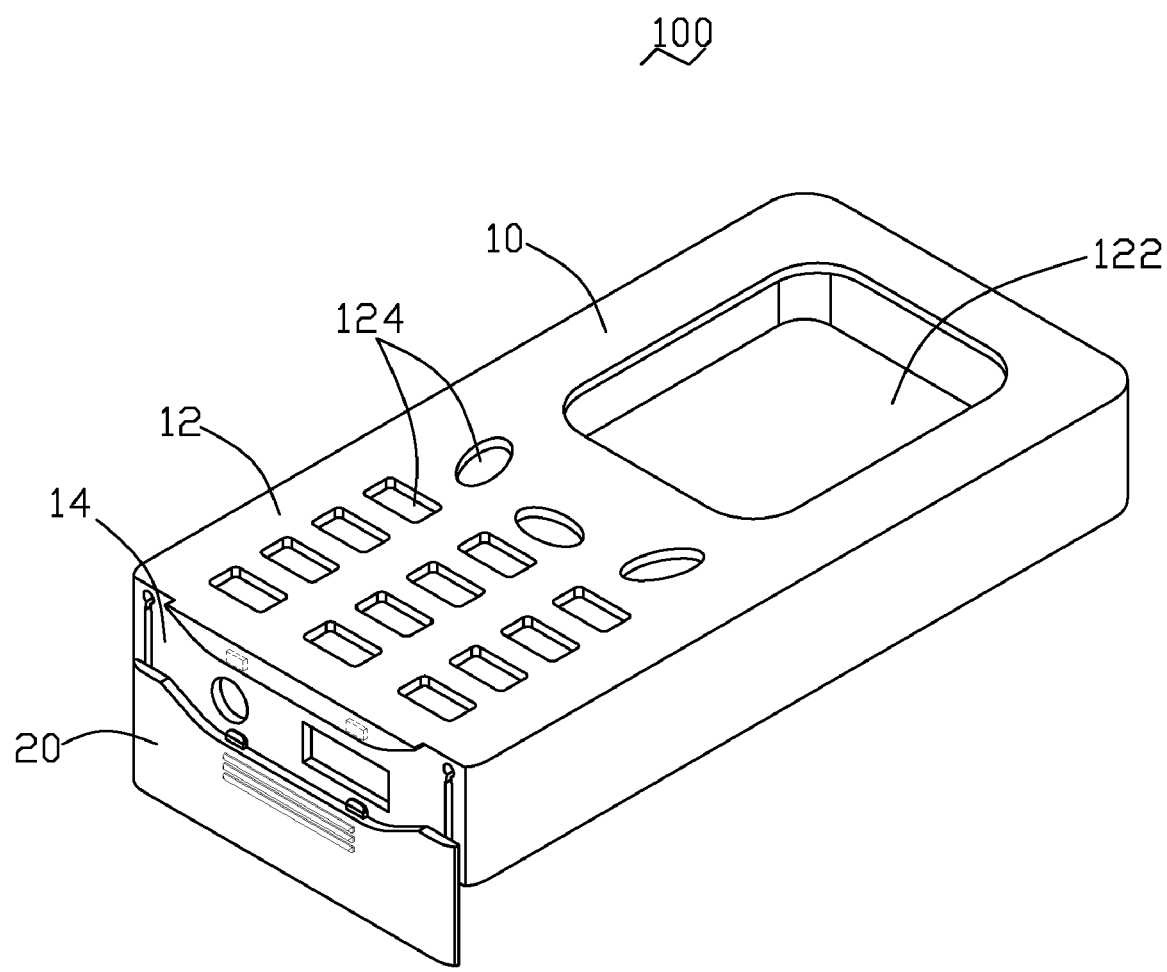
FIG. 1 is an assembled, isometric view of a housing mechanism having a shield in an open state, in accordance with a present embodiment.

Referring to FIG. 1, the present housing mechanism 100 includes a main body 10 and a shield 20. The main body 10 is a substantially rectangular in shape and has an upper surface 12 and a sidewall 14. The sidewall 14 extends substantially perpendicularly from the upper surface 12. A display window 122 and a plurality of holes 124 for holding keypads are generally defined in parallel rows and columns, extending through the upper surface 12. It is to be understood, however that exact locations of the display window and the keypad holes 124 could be varied and still be within the scope of the present housing mechanism 100.

Figure 2:
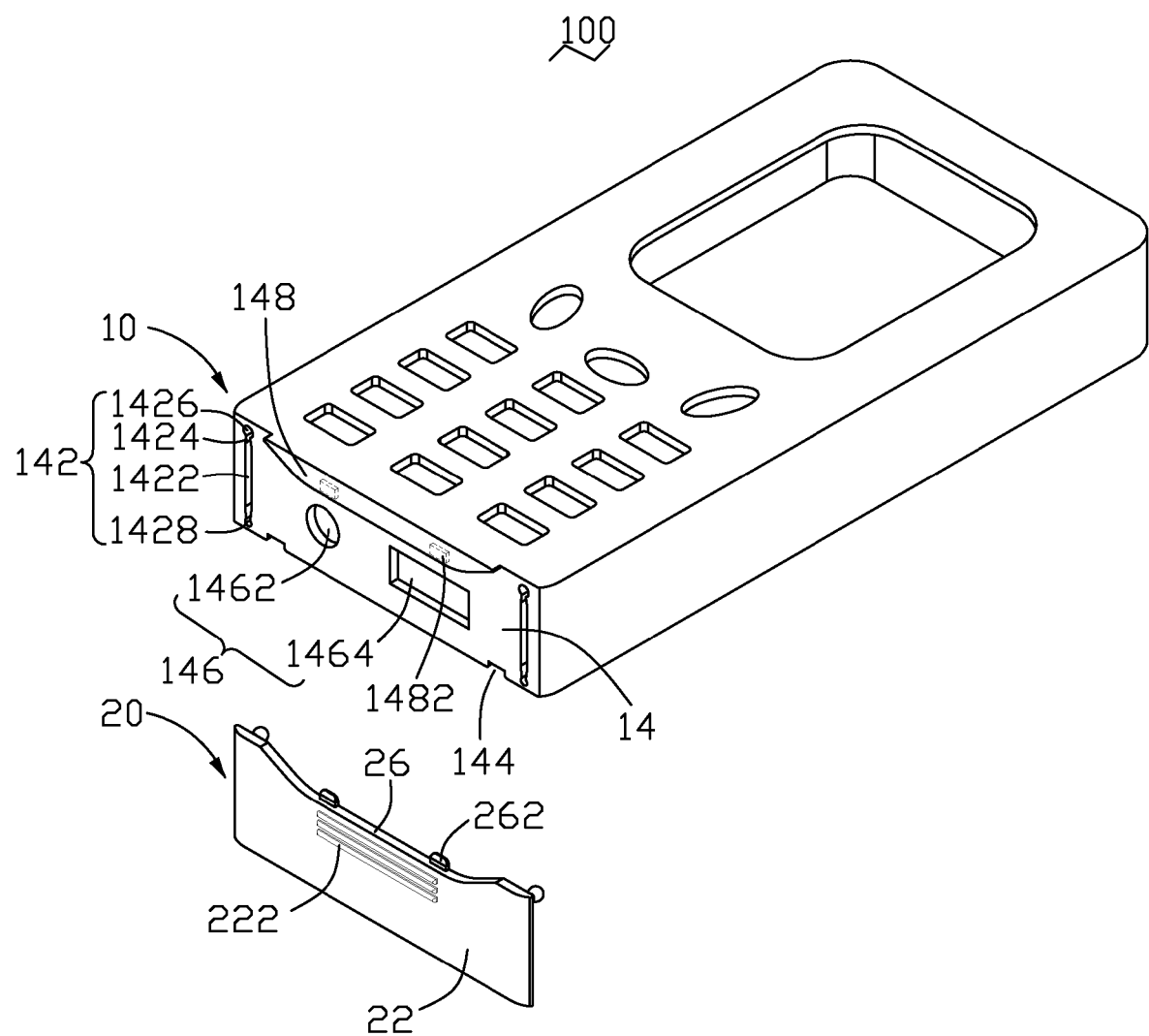
FIG. 2 is an exploded, isometric view of the housing mechanism shown in FIG. 1.
Figure 3:
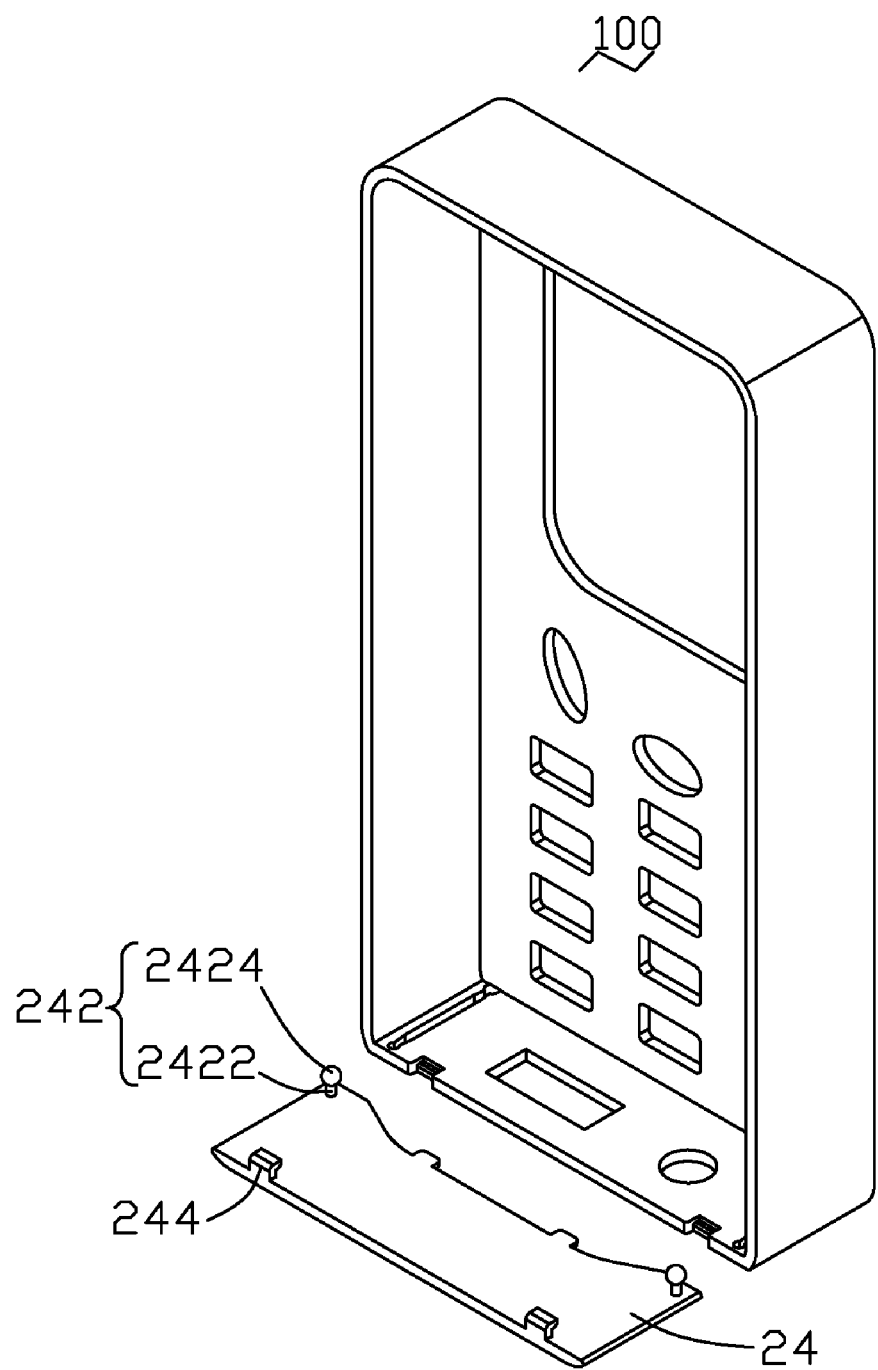
FIG. 3 is an exploded, isometric view of the housing mechanism of FIG. 1, viewed from an inner aspect thereof.
Figure 4:
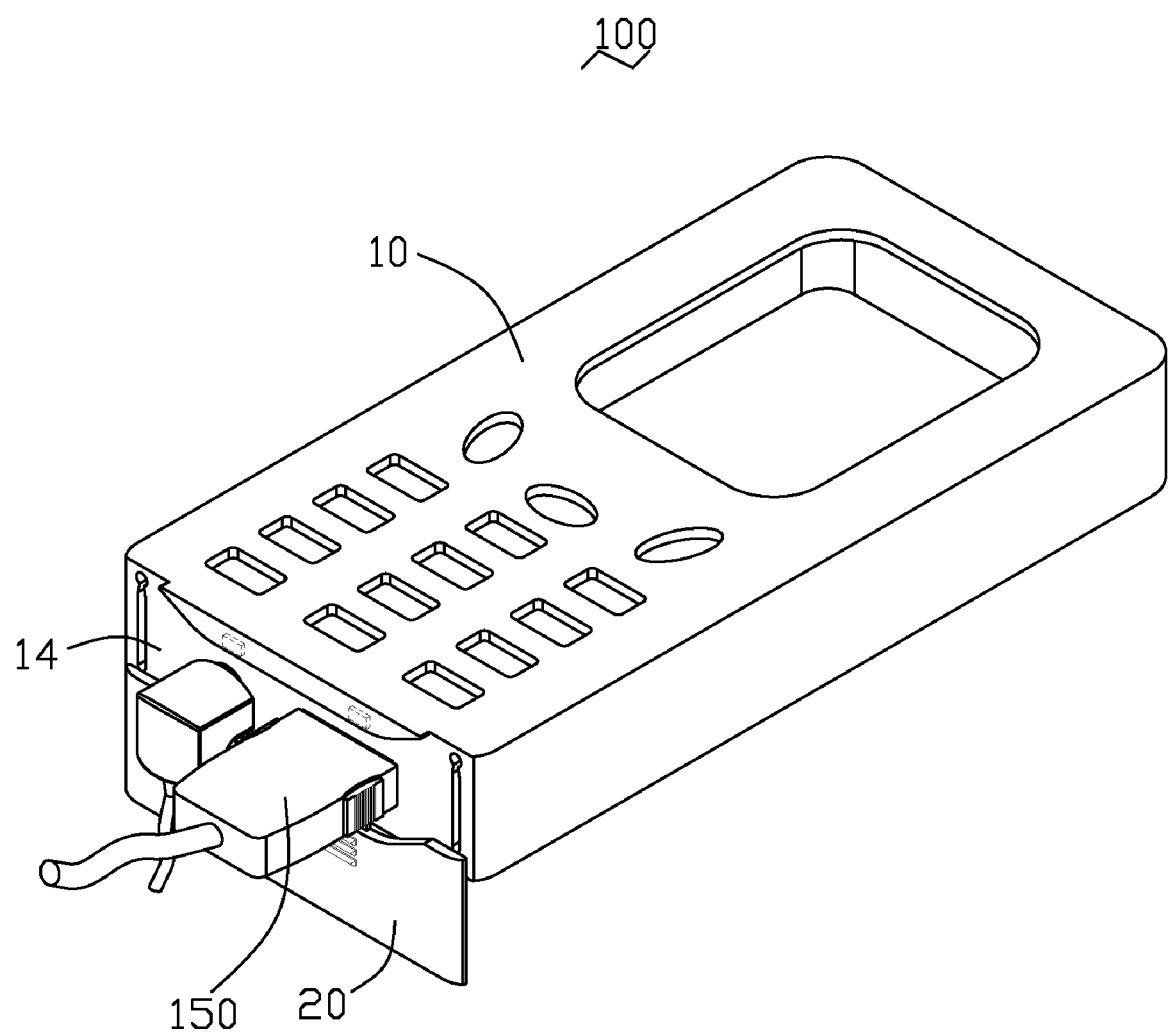
FIG. 4 is an assembled, isometric view of the housing mechanism of FIG. 1, in an operational state.

Also referring to FIGS. 2-4, the main body 10 defines a pair of guiding portions/slots 142, two latching notches 144, and at least one port 146 through the sidewall 14. The two guiding portions 142 are defined in parallel and respectively proximate to two opposite sides of the sidewall 14. The latching notches 144 are located between the guiding portions 142 within the face of the sidewall 14, with each latching notch 144 being proximate yet spaced from a respective guiding portion 142. Further, each latching notch 144 is positioned near/proximate the bottom edge (i.e., opposite the upper surface 12) of the sidewall 14. As such, each latching notch 144 opens away from the upper surface 12.

Each of the guiding portions 142 has a groove 1422 and two recesses 1424 defined respectively in the two ends of the groove 1422. A first receiving hole 1426 and a second receiving hole 1428 are respectively provided in the corresponding two ends of each the guiding portions 142 and communicate with the groove 1422 and the respective recesses 1424. The first receiving hole 1426 and the second receiving hole 1428 are round holes, and the diameters thereof are equal to the width of the grooves 1422. Each of the recesses 1424 is wedge-shaped, and the width thereof grows narrower towards the first receiving hole 1426 or the second receiving hole 1428, as the case may be.

The main body 10 defines at least one port 146 through which the connector 150 can be inserted into the main body 10. An inner interface is provided in the main body 10, near the port 146. A connector 150 is configured for being inserted into the port 146, thereby engaging an outer interface of the connector 150 with the inner interface of the main body 10 to transmit data and/or power, depending on the linkage type, therebetween. The at least one port 146 includes at least one element selected from a round port 1462 and a quadrate port 1464 and is located between the two guiding portions 142.

A flange 148 is formed on the sidewall 14 near/proximate the upper surface 12, actually first co-extending from the upper surface 12 and then extending perpendicularly downward so as to parallel the sidewall 14. The flange 148 does not overlay the two guiding portions 142, two latching notches 144, and/or the at least one port 146. The portion of the flange 148 paralleling the sidewall 14 is generally arc-shaped at the ends thereof and straight in the central section therebetween and is configured for matingly engaging with the shape of a corresponding edge of the shield 20. Two holding holes 1482 are defined in the portion of the flange 148 paralleling the sidewall 14, such holding holes 1482 opening toward the sidewall 14.

The shield 20 is attached to the main body 10 and is configured (i.e., structured and arranged) for covering and thereby protecting the port 146 when no connector 150 is inserted. The shield 20 is, e.g., formed from a substantially rectangular board (e.g., via a machine press or a cutting operation) or is directly molded to have the desired shape and is configured for being mountable to the sidewall 14 of the main body 10.

The shield 20 includes an opposite outer surface 22 and inner surface 24 and further defines a recessed portion 26 provided in center of a side of the shield 20. Several friction lines 222, in the form of linear protrusions, are provided on the outer surface 22 to aid in the manual opening/closing of the shield 20. Two guiding poles 242 and two latches 244 are respectively formed on the two opposite sides of the inner surface 24. The guiding poles 242 are configured for being selectively receivable in the first receiving holes 1426 and the second receiving holes 1428 of the main body 10. The two guiding poles 242 are positioned on the same side as the recessed portion 26. The recessed portion 26 is positioned between the two guiding poles 242. Each of such guiding poles 242 includes a pole body 2422 and an end portion 2424. The diameter of the pole body 2422 is identical to the width of the groove 1422, and the pole body 2422 can slide in the groove 1422. The end portion 2424 is spheroid in shape, and the diameter thereof is slightly larger than that of the first receiving hole 1426 and the second receiving hole 1428. The two guiding poles 242 are made of elastomeric materials. The end portion 2424 can be inserted (e.g., snap-fit) through a respective one of the first receiving hole 1426 and the second receiving hole 1428 using an external force.

The latches 244 each initially extend directly and perpendicularly from the inner surface 24 and then bend so that a second portion of each is aligned parallel to the inner surface 24. Further, each latch 244 is respectively opposite to a corresponding guiding pole 242. The two latches 244 cooperate with the two latching notches 144, so as to connect the shield 20 with the sidewall 14 when the shield 20 is closed.

Two blocks 262 extending from the recessed portion 26 cooperate with the two holding holes 1482 defined in the flange 148. The shape of the recessed portion 26 is in accordance with that of the flange 148. Thus, when the shield 20 is closed, the blocks 262 are fixed into the holding holes 1482, and the recessed portion 26 and flange 148 can join/connect with each other.

In assembly, the end portion 2424 of each the guiding poles 242 is respectively snap-fit into the second receiving holes 1428, so that the shield 20 is connected with the sidewall 14 of the main body 10.

Figure 5:
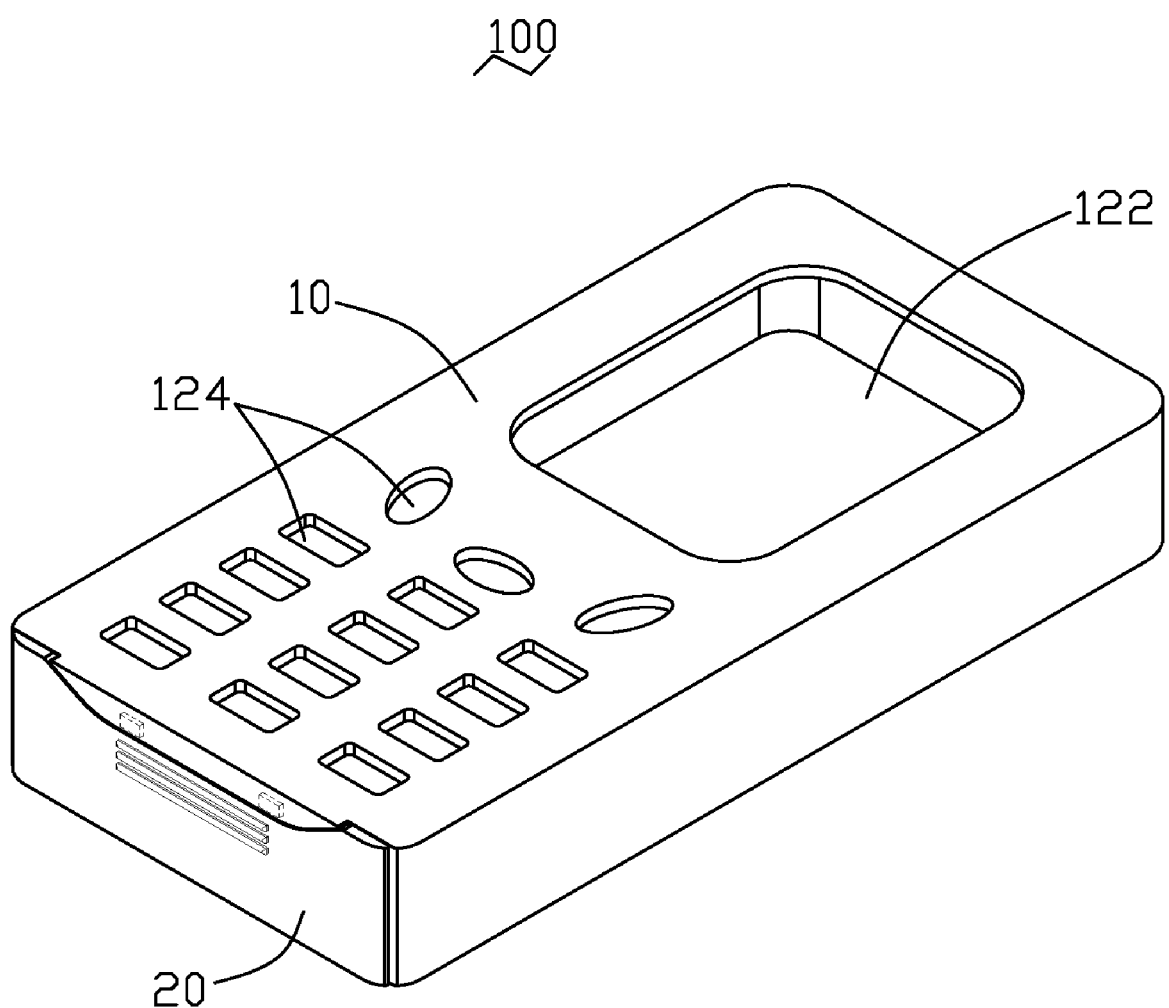
FIG. 5 is an assembled, isometric view of the housing mechanism of FIG. 1, showing the shield in a closed state.

Also referring to FIG. 5, in use, when there is no connector 150 inserted into the port 146, the two guiding poles 242 are slid from the second receiving holes 1428 to the first receiving holes 1426 through the recesses 1424 and the groove 1422 using an external force. The blocks 262 of the shield 20 cooperate with the holding holes 1482 of main body 10, and the two latches 244 of the shield 20 engage with the two latching notches 144 of the main body 10, so that the shield 20 can be fixed with the sidewall 14. The shield 20 covers the at least one port 146, thus protecting it from contamination/potential shortage.

Referring to FIG. 4 again, when there is any connector 150 insert into the port 146, the shield 20 is slid downwardly to facilitate access to the port 146. The shield 20 is pushed by an external force (e.g., a user), advantageously employing the friction lines/grips 222. The blocks 262 and the latches 144 are respectively moved apart and away the holding holes 1482 and the latching notches 144. The guiding poles 242 slide from the first receiving holes 1426 to the second receiving holes 1428 through the recesses 1424 and the groove 1422 of each the guiding portions 142. When the guiding poles 242 are held by the second receiving holes 1428, the shield 20 is substantially open, the at least one port 146 can be accessed.

It should to be understood that the flange 148 and latching notches 144 of the main body 10, the recessed portion 26 and latches 244 of the shield 20 can be omitted as a whole, or respective subcombinations thereof could be omitted. Further, for example, just one latch 244 and corresponding latch notch 144 could be provided, or three or more such latch/notch combinations could be included. The shield 20 can be a rectangular board, and the shield 20 can, potentially, be open or closed to the sidewall 14 only with the cooperation of the guiding poles 242 and the guiding portions 142. The present housing mechanism 100 is suitable for portable electronic devices such as digital cameras, mp3 players, video cameras, mobile phones, PDAs, and the like.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A housing mechanism for a portable electronic device, the housing mechanism comprising:
   a main body including a pair of guiding portions and at least one port defined through a sidewall thereof; and
   a shield including a pair of guiding poles provided on an inner surface thereof;
   wherein the shield cooperates with the main body, the guiding poles slide in the corresponding guiding portions and are selectively positioned between two ends of the guiding portions to thereby permit the shield to selectably cover and uncover the port;
   wherein each of the guiding portions has a groove and two recesses defined respectively in the two ends of the groove, and a first receiving hole and a second receiving hole are respectively provided in two ends of each the guiding portions and communicate with the groove and the recesses.

2. The housing mechanism as claimed in claim 1, wherein the pair of guiding portions are defined in parallel and respectively proximate to two opposite sides of the sidewall, and the at least one port is positioned between the pair of guiding portions.

3. The housing mechanism as claimed in claim 2, wherein the diameter of the first receiving hole and the second receiving hole is equal to the width of the groove; each of the recesses is wedge-shaped and the width thereof grows narrower towards a respective one of the first receiving hole and the second receiving hole.

4. The housing mechanism as claimed in claim 1, wherein the guiding poles are configured for sliding within the guiding portions and being selectively receivable in the first receiving holes and the second receiving holes of the main body, each of the guiding poles including a pole body and an end portion.

5. The housing mechanism as claimed in claim 4, wherein the diameter of the pole body is identical to the width of the groove, the diameter of the end portion is slightly larger than that of the first receiving hole and the second receiving hole, the end portion being configured for snap-fitting through a respective one of the first receiving hole and the second receiving hole.

6. The housing mechanism as claimed in claim 1, further comprising a pair of latching notches defined through the sidewall of the main body, wherein the latching notches are spaced from the guiding portions and positioned proximate to the edge of the sidewall.

7. The housing mechanism as claimed in claim 6, further comprising a pair of latches initially extending perpendicularly from the inner surface of the shield, the latches being configured for cooperating with the latching notches to connect the shield with the main body.

8. The housing mechanism as claimed in claim 1, further comprising a flange formed proximate an edge of the sidewall, the flange having a pair of holding holes is defined therein.

9. The housing mechanism as claimed in claim 8, further comprising a recessed portion provided in center of a side of the shield, wherein the shape of the recessed portion matches that of the flange, the recessed portion having a pair of blocks extending therefrom, the pair of blocks being configured for respectively cooperating with the holding holes defined in the flange.

10. A housing mechanism for a portable electronic device, the housing mechanism comprising:
   a main body having an upper surface and a sidewall extending substantially perpendicularly from the upper surface; the main body defining a pair of guiding slots and at least one port through the sidewall, each of the guiding slots including a groove, two recesses defined respectively in the two ends of the groove, and a first receiving hole and a second receiving hole respectively provided in two ends of each guiding slots and communicating with the groove and the recesses; and
   a shield including a pair of guiding poles provided on an inner surface thereof;
   wherein the shield cooperates with the main body, the guiding poles slide in the corresponding grooves and being selectively receivable in the first receiving holes and the second receiving holes of the main body in a direction parallel to the sidewall and are selectively positioned between two ends of the guiding slots to thereby permit the shield to selectably cover and uncover the port.

11. The housing mechanism as claimed in claim 10, wherein, each of the guiding poles including a pole body and an end portion; the diameter of the pole body is identical to the width of the groove and can slide in the groove; the end portion is spheroid in shape and the diameter thereof is slightly larger than that of the first receiving hole and the second receiving hole, the end portion being configured for snap-fitting through a respective one of the first receiving hole and the second receiving hole.

12. The housing mechanism as claimed in claim 11, wherein, the main body further comprises a pair of latching notches defined through the sidewall thereof; the shield further comprises a pair of latches initially extending perpendicularly from the inner surface of the shield, the latches being configured for cooperating with the latching notches to connect the shield with the main body.

13. The housing mechanism as claimed in claim 11, wherein, the main body further includes a display window and a plurality of holes for holding keypads defined in parallel rows and columns through the upper surface.

* * * * *